(12) United States Patent
Yamamoto

(10) Patent No.: US 7,446,460 B2
(45) Date of Patent: Nov. 4, 2008

(54) PIEZOELECTRIC DEVICE

(75) Inventor: Takehiro Yamamoto, Tokyo (JP)

(73) Assignee: Epson Toyocom Corporation, Tokyo (JP)

( * ) Notice: Subject to any disclaimer, the term of this patent is extended or adjusted under 35 U.S.C. 154(b) by 4 days.

(21) Appl. No.: 11/806,816

(22) Filed: Jun. 4, 2007

(65) Prior Publication Data
US 2007/0278903 A1     Dec. 6, 2007

(30) Foreign Application Priority Data
Jun. 5, 2006     (JP)     ............... 2006-155782

(51) Int. Cl.
*H01L 41/053*     (2006.01)
(52) U.S. Cl. .................. 310/340; 310/348; 310/366
(58) Field of Classification Search ............. 310/340, 310/344, 348, 363–366
See application file for complete search history.

(56) References Cited

U.S. PATENT DOCUMENTS

| 6,229,249 | B1 * | 5/2001 | Hatanaka et al. ............ 310/348 |
| 2007/0176517 | A1 * | 8/2007 | Moriya et al. ............... 310/348 |
| 2007/0247029 | A1 * | 10/2007 | Maruyama .................. 310/348 |
| 2007/0247030 | A1 * | 10/2007 | Naruse ....................... 310/348 |
| 2007/0252482 | A1 * | 11/2007 | Sakai ......................... 310/348 |

FOREIGN PATENT DOCUMENTS

| JP | A-2005-101219 | 4/2005 |
| JP | A 2005-117188 | 4/2005 |
| JP | A-2006-060281 | 3/2006 |
| JP | A-2006-074736 | 3/2006 |

* cited by examiner

*Primary Examiner*—Thomas M Dougherty
(74) *Attorney, Agent, or Firm*—Oliff & Berridge, PLC

(57) ABSTRACT

A piezoelectric device includes a piezoelectric element, a circuit board on which the piezoelectric element is mounted, an IC component having at least a function of oscillating the piezoelectric element and connected to a bottom face of the circuit board, an insulating section covering at least a part of the IC component, a circuit connection terminal formed on a main surface of the IC component, an internal connection bump formed on the circuit connection terminal and connected to the circuit connection terminal and the bottom face of the circuit board, a functional terminal formed on a main surface of the IC component, a back surface electrode formed on a back surface of the IC component, a penetrating electrode penetrating the IC component from the main surface to the back surface and connecting the functional electrode and the back surface electrode to each other, an external connection bump connected to the back surface electrode, and a mounting terminal formed on a surface of the insulating section, and a part of the external connection bump is exposed from the surface of the insulating section and is connected to the mounting terminal.

2 Claims, 2 Drawing Sheets

PIEZOELECTRIC DEVICE

BACKGROUND OF THE INVENTION

1. Technical Field

The present invention relates to a piezoelectric device.

2. Related Art

Piezoelectric devices represented by a quartz crystal oscillator have conventionally been provided with a piezoelectric vibrator and an oscillation circuit, and used as a clock frequency source of various electronic apparatuses such as a mobile communication apparatus or a portable electronic apparatus.

In accordance with downsizing and low-profiling of electronic apparatuses, further downsizing and low-profiling are required also to piezoelectric devices. For example, as a downsized and low-profiled quartz crystal oscillator, a piezoelectric device having an IC component with a function such as an oscillation circuit disposed at the bottom of a piezoelectric vibrator is known, and the piezoelectric device having a structure provided with a mounting terminal formed of a conductive adhesive extending from a bottom terminal formed at the bottom of the piezoelectric vibrator to the side face and the bottom face of the IC component is disclosed in JP-A-2005-117 (pp. 5-6, FIG. 1).

However, in the structure of the piezoelectric device provided with the mounting terminal formed of a conductive adhesive described above, if the conductive adhesive is applied thereon using a dispenser, it is difficult to control the thickness of the conductive adhesive, and accordingly, there are some cases in which variation is caused in the thickness of the mounting terminal to hinder obtaining sufficient evenness of the mounting terminal of the piezoelectric device.

Further, since the appropriate evenness of the mounting terminal cannot be obtained, a gap is caused between the mounting terminal of the piezoelectric device and a printed board in mounting the piezoelectric device on the printed board, and accordingly, there are some cases in which a problem arises that a mounting failure such as a conduction error between the mounting terminal and the printed board is caused.

Further, if it is attempted to form the mounting terminal thinner, the thickness of the mounting terminal becomes partially thin because of the difficulty in controlling the thickness of the conductive adhesive, thus there are come cases in which a problem arises that a broken line or a conduction failure is caused especially at the boundary between the upper face and the side face of the IC component or a boundary between the side face and the bottom face of the IC component.

Therefore, sufficient thickness of the mounting terminal is required to be assured in order for avoiding such conduction failure problems, which causes a problem that low-profiling of the piezoelectric device cannot sufficiently be achieved.

SUMMARY

In view of such problems in the related art, the invention has an advantage of providing a piezoelectric device capable of reliably connecting the IC component and the mounting terminal to each other with a simple structure and allowing downsizing and low-profiling thereof.

A piezoelectric device according to an aspect of the invention includes a piezoelectric element, a circuit board on which the piezoelectric element is mounted, an IC component having at least a function of oscillating the piezoelectric element and connected to a bottom face of the circuit board, an insulating section covering at least a part of the IC component, a circuit connection terminal formed on a main surface of the IC component, an internal connection bump formed on the circuit connection terminal and connected to the circuit connection terminal and the bottom face of the circuit board, a functional terminal formed on a main surface of the IC component, a back surface electrode formed on a back surface of the IC component, a penetrating electrode penetrating the IC component from the main surface to the back surface and connecting the functional electrode and the back surface electrode to each other, an external connection bump connected to the back surface electrode, and a mounting terminal formed on a surface of the insulating section, and a part of the external connection bump is exposed from the surface of the insulating section and is connected to the mounting terminal.

According to this configuration, the mounting terminal is formed on one plane of the surface of the insulating section on which a part of the external connection bump is exposed, and is connected to the external bump. Therefore, it becomes possible to provide a piezoelectric device capable of reliably connecting the IC chip 2 and the mounting terminals 5 to each other with a simple structure by preventing the mounting terminals from being laid on the outside surface of the piezoelectric device in comparison with the structure of the related art having the mounting terminals formed of the conductive adhesive extending from the side face to the bottom face of the IC component.

In the piezoelectric device according to anther aspect of the invention, the mounting terminal formed on the surface of the insulating section is formed using conductive ink and fixed to the insulating section.

According to this configuration, by ejecting the conductive ink using the inkjet method, the mounting terminals can be formed with fine shapes and high positional accuracy.

BRIEF DESCRIPTION OF THE DRAWINGS

The invention will now be described with reference to the accompanying drawings, wherein like numbers refer to like elements.

DESCRIPTION OF THE EMBODIMENTS

Hereinafter, embodiments of the invention will be described with reference to the accompanying drawings.

Embodiments

In the following embodiment, explanations are provided taking a quartz crystal oscillator as an example of the piezoelectric device.

Figure 1A:
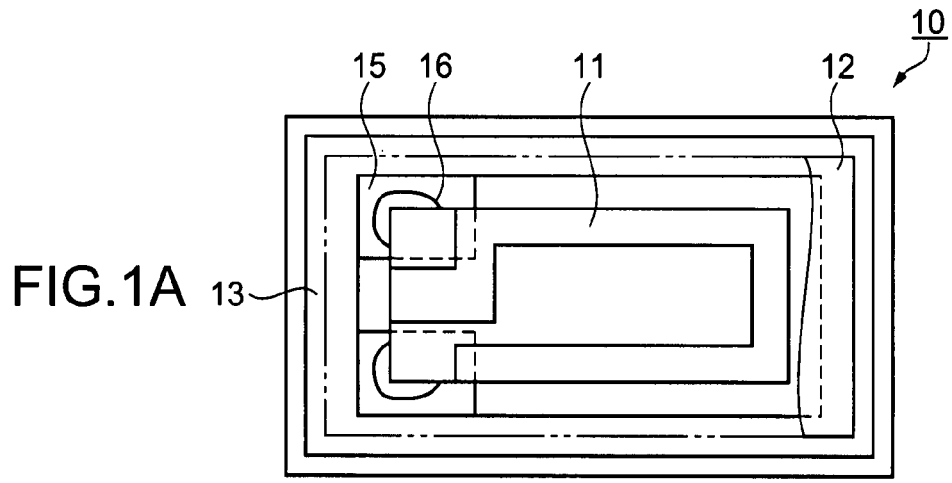
FIG. 1A is a schematic plan view of a quartz crystal oscillator in the present embodiment.
Figure 1B:
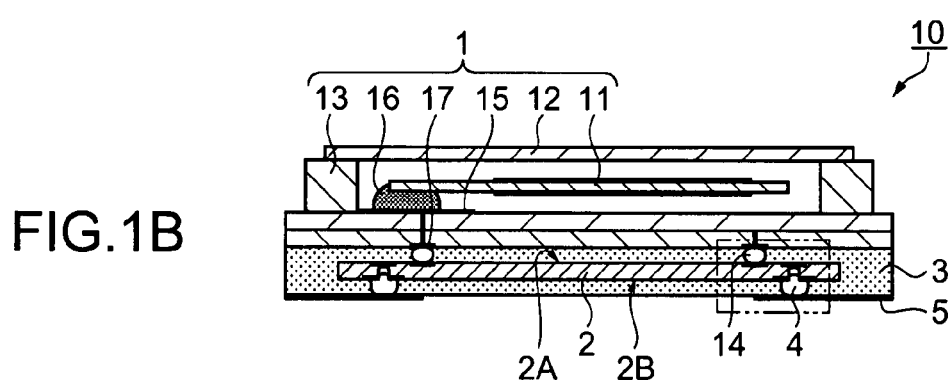
FIG. 1B is a schematic cross-sectional view of FIG. 1A.
Figure 1C:
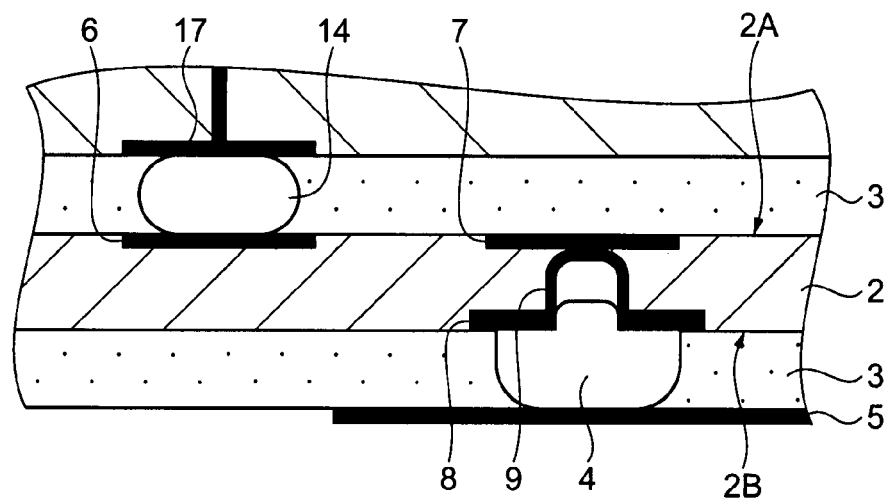
FIG. 1C is a partial enlarged view of FIG. 1B.

FIGS. 1A through 1C show a configuration of a quartz crystal oscillator 10 of the present embodiment, wherein FIG. 1A is a schematic plan view of a quartz crystal oscillator in the present embodiment, FIG. 1B is a schematic cross-sectional view of FIG. 1A, and FIG. 1C is a partial enlarged view of FIG. 1B.

The quartz crystal oscillator 10 is provided with a quartz crystal vibrator 1 as a piezoelectric vibrator, an IC chip 2 as an IC component provided with a function of oscillating the quartz crystal vibrator 1, an insulating section 3 having an insulating property and made of epoxy resin or the like, and a mounting terminal 5 formed of conductive ink.

The quartz crystal vibrator 1 is provided with a quartz crystal vibration segment 11 as a piezoelectric element, a package 13 as a circuit board made of ceramic or the like, and a lid member 12 made of metal or the like.

In the package 13, there are formed electrode sections 15 made of Au or the like. The quartz crystal vibration segment 11 is fixed to the electrode sections 15 with a conductive adhesive 16 made of adhesive resin containing conductive particles such as silver (Ag), and excitation electrodes provided to the quartz crystal vibration segment 11 are connected to the electrode sections 15.

Further, on the back surface of the package 13 there are formed bottom terminals 17 made of Au or the like. The bottom terminals 17 are respectively connected to the electrode sections 15 via internal wiring of the package 13. Further, the package 13 housing the quartz crystal vibration segment 11 is airtightly sealed by the lid member 12, thus obtaining the quartz crystal vibrator 1.

On a main surface 2A, the surface on which the circuit components of the IC chip 2 is formed, there are formed circuit connection terminals 6 and functional terminals 7 made of Au, aluminum (Al), or the like. The circuit connection terminals 6 are connected to the bottom terminals 17 of the quartz crystal vibrator 1 with an internal connection bumps 14 made of Au or the like, respectively. Further, the circuit connection terminals 6 and the functional terminals 7 are connected to a circuit inside the IC chip 2 provided with a function of oscillating the quartz crystal vibration segment 11 and so on.

It should be noted that the material for the internal connection bumps 14 is not limited to Au, but a metal such as Al or Ag, or an alloy such as solder can also be used therefor.

Further, the functional terminals 7 are terminals electrically connected to signal output sections, power input sections, ground, and so on in the circuit of the IC chip 2.

On the back surface 2B of the IC chip 2, which is in a front-back relationship with the main surface 2A thereof, there are formed back surface electrodes 8 made of Au, Al or the like. Further, there are formed penetrating electrodes 9 passing through the IC chip 2 from the main surface 2A to the back surface 2B using Au, Al or the like. The functional terminals 7 formed on the main surface 2A and the back surface electrode 8 formed on the back surface 2B are respectively connected to each other via the penetrating electrodes 9.

External connection bumps 4 made of Au or the like are formed on the back surface electrodes 8 formed on the back surface 2B of the IC chip 2, and are connected to the back surface electrodes 8.

It should be noted that the material for the external connection bumps 4 is not limited to Au, but a metal such as Al or Ag, or an alloy such as solder can also be used therefor.

The insulating section 3 made of epoxy resin or the like having an insulating property is formed so as to cover the IC chip 2 and to expose a part of each of the external connection bumps 4.

The mounting terminals 5 are formed on a plane of the insulating section 3 where the external connection bumps 4 are exposed using conductive ink (conductive coating material), and are respectively connected to the external connection bumps 4.

FIGS. 2A through 2F are schematic process charts showing an example of a method of manufacturing the quartz crystal oscillator 10 of the present embodiment.

Figure 2A:
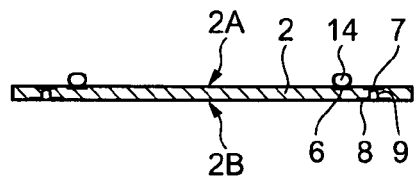
FIGS. 2A through 2F are schematic process charts showing a method of manufacturing the quartz crystal oscillator of the present embodiment.
Figure 2B:
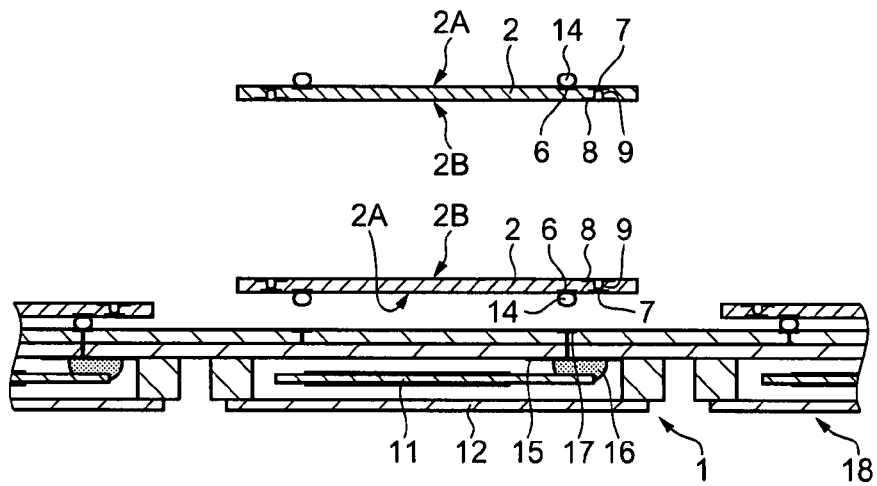
Figure 2C:
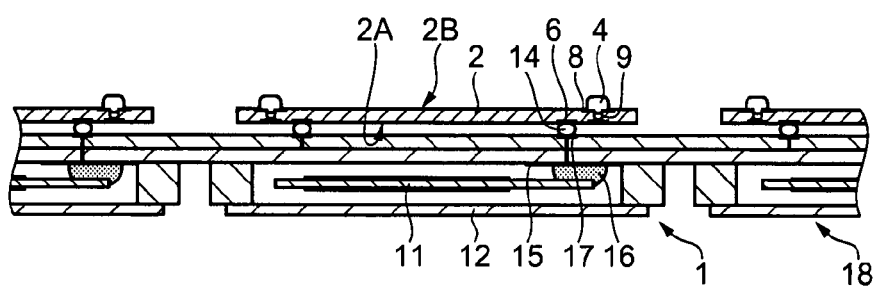
Figure 2D:
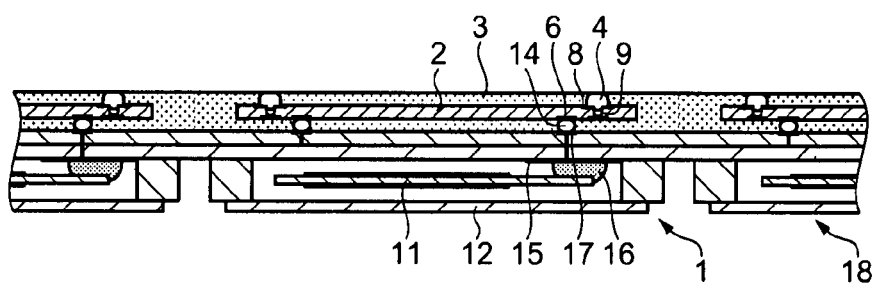
Figure 2E:
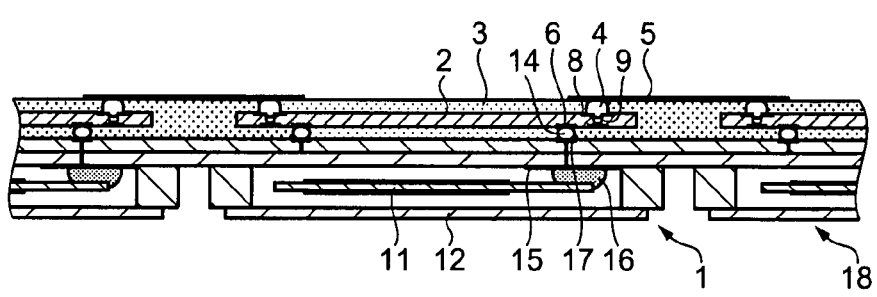
Figure 2F:
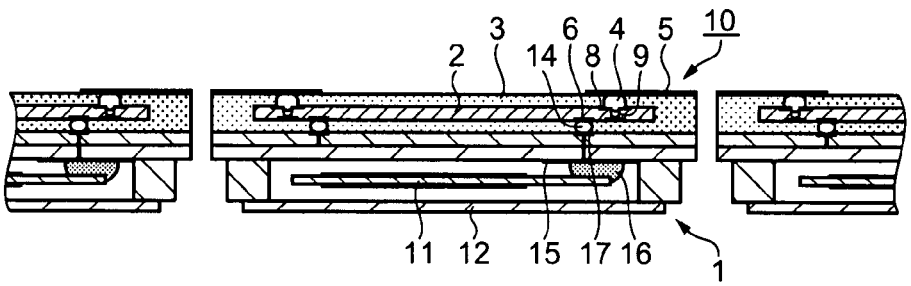

FIG. 2A shows an internal connection bump forming process. FIG. 2B shows an IC component mounting process. FIG. 2C shows an external connection bump forming process. FIG. 2D shows a resin filling process. FIG. 2E shows a mounting terminal forming process. FIG. 2F shows a cutting process.

As shown in FIG. 2A, the internal connection bumps 14 made of Au are formed on the circuit connection terminals 6 formed on the main surface 2A of the IC chip 2.

Subsequently, as shown in FIG. 2B, the IC chip 2 is mounted on the back surface of the quartz crystal vibrator 1 by flip chip bonding while disposing the IC chip 2 thereon so that the internal connection bumps 14 are respectively located on the bottom terminals 17 of the quartz crystal vibrator 1 provided on the back surface of a vibrator substrate 18 composed of a plurality of the quartz crystal vibrators 1 linked with each other.

Then, as shown in FIG. 2C, the external connection bumps 4 made of Au or the like are formed on the back surface electrodes 8 of the IC chip 2. Thus, the external connection bumps 4 are connected to a circuit inside the IC chip 2 provided with a function of oscillating the quartz crystal vibration segment 11 and so on via the penetrating electrodes 9 and the functional terminals 7.

Subsequently, after disposing the vibrator substrate 18 and the IC chip 2 in a metal mold for molding the insulating section 3, the metal mold is filled with insulating resin made of epoxy resin or the like having an insulating property to completely cover the IC chip 2. In this case, the amount of the insulating resin filled therein is appropriately selected so that the part of each of the external connection bumps 4 is exposed. Subsequently, a curing process is performed thereon.

Thus, as shown in FIG. 2D, the insulating section 3 is formed. In this case, the IC chip 2 connected to the back surface of the quartz crystal vibrator 1 is covered by the insulating section 3, and a part of each of the external connection bumps 4 connected to the back surface electrodes 8 is exposed.

Subsequently, as shown in FIG. 2E, the conductive ink is ejected by the droplet ejection method on the surface of the insulating section 3 where the external connection bumps 4 are exposed, and then the curing process is performed thereon, thus forming the mounting terminals 5. Thus, the mounting terminals 5 are connected to the external connection bumps 4, respectively.

It should be noted here that although there are various ejection methods in the droplet ejection method, an inkjet method capable of forming a fine shape is preferably used. Further, as the method of forming the mounting terminals 5, a screen printing method using a mask with holes bored to have the shape of the mounting terminals 5 can also be used.

Subsequently, as shown in FIG. 2F, the vibrator substrate 18 and the insulating section 3 are cut to obtain individual quartz crystal oscillators 10, thus the quartz crystal oscillator 10 shown in FIGS. 1A through 1C is completed.

As described hereinabove, the quartz crystal oscillator 10 of the present embodiment is provided with mounting terminals 5 formed on a surface of the insulating section 3 where a part of each of the external connection bumps 4 is exposed, and the mounting terminals 5 are connected to the external connection bumps 4, respectively. Therefore, in comparison with the structure of the related art having the mounting terminals formed of the conductive adhesive extending from the side face to the bottom face of the IC component, the mounting terminals can be prevented from being laid on the outside surface of the piezoelectric device, thus reliably connecting the IC chip 2 and the mounting terminals 5 to each other with a simple structure. Further, by ejecting the conductive ink using the inkjet method, the mounting terminals can be formed with fine shapes and high positional accuracy.

It should be noted that the invention is not limited to the embodiment described above but includes modifications and improvements in a range where the advantages of the invention can be achieved.

For example, although in the embodiment described above, the manufacturing method of providing the IC component, the insulating section and so on to the vibrator substrate composed of a plurality of quartz crystal vibrators linked with each other is adopted, a manufacturing method of providing the IC component, the insulating section, and so on to a discretely formed quartz crystal vibrator can also be adopted.

The piezoelectric device according to the invention can be applied not only to the piezoelectric oscillator such as a quartz crystal oscillator described above but also to a surface acoustic wave filter or a piezoelectric vibration gyro sensor.

What is claimed is:

1. A piezoelectric device comprising:
a piezoelectric element;
a circuit board on which the piezoelectric element is mounted;
an IC component having at least a function of oscillating the piezoelectric element and connected to a bottom face of the circuit board;
an insulating section covering at least a part of the IC component;
a circuit connection terminal formed on a main surface of the IC component;
an internal connection bump formed on the circuit connection terminal and connected to the circuit connection terminal and the bottom face of the circuit board;
a functional terminal formed on a main surface of the IC component;
a back surface electrode formed on a back surface of the IC component;
a penetrating electrode penetrating the IC component from the main surface to the back surface and connecting the functional electrode and the back surface electrode to each other;
an external connection bump connected to the back surface electrode; and
a mounting terminal formed on a surface of the insulating section,
wherein a part of the external connection bump is exposed from the surface of the insulating section and is connected to the mounting terminal.

2. The piezoelectric device according to claim 1,
wherein the mounting terminal formed on the surface of the insulating section is formed using conductive ink and fixed to the insulating section.

* * * * *